United States Patent

Torihata et al.

Patent Number: 5,435,477
Date of Patent: Jul. 25, 1995

[54] WIRE CLAMPERS

[75] Inventors: Minoru Torihata; Takayuki Iiyama, both of Tokyo, Japan

[73] Assignee: Kabushiki Kaisha Shinkawa, Tokyo, Japan

[21] Appl. No.: 190,307

[22] Filed: Feb. 2, 1994

[30] Foreign Application Priority Data

Mar. 9, 1993 [JP] Japan .................. 5-072854

[51] Int. Cl.⁶ .................. B23K 37/04; H01L 21/60
[52] U.S. Cl. .................. 228/4.5; 228/49.5; 228/56.5
[58] Field of Search .................. 228/4.5, 47.1, 49.5, 228/56.5, 180.5, 904; 269/224, 254 R; 310/328

[56] References Cited

U.S. PATENT DOCUMENTS

| | | | |
|---|---|---|---|
| 4,485,957 | 12/1984 | Sugimoto et al. | 228/4.5 |
| 5,314,175 | 5/1994 | Izumi et al. | 269/224 |

FOREIGN PATENT DOCUMENTS

| | | | |
|---|---|---|---|
| 61-2294 | 1/1986 | Japan . | |
| 61-079238 | 4/1986 | Japan | 228/4.5 |
| 61-101042 | 5/1986 | Japan | 228/4.5 |
| 1-198037 | 8/1989 | Japan | 228/4.5 |
| 2-068942 | 3/1990 | Japan | 228/4.5 |
| 2-130844 | 5/1990 | Japan | 228/4.5 |
| 5-259213 | 10/1993 | Japan | 228/4.5 |

OTHER PUBLICATIONS

Patent Abstracts of Japan, Abs Grp No: E135, Abs Vol No: vol. 6, No. 200, Abs Pub Date Oct. 9, 1992, JP 57-111039, Wire Clamper.

Primary Examiner—Samuel M. Heinrich
Attorney, Agent, or Firm—Koda and Androlia

[57] ABSTRACT

A wire clamper used in a wire bonding apparatus including a pair of open/close clamping arms and a pair of clamping elements provided at terminal ends of the clamping arms so as to clamp a bonding wire in between, and at least one of the clamper arms is opened and closed by the electric strain or magnetic strain effect of a piezoelectric element. In addition, a clamping load adjustment screw is installed at the root end of the wire clamper so that it can set an initial clamping load of the clamping elements.

3 Claims, 2 Drawing Sheets

1

WIRE CLAMPERS

BACKGROUND OF THE INVENTION

1. Field of the Invention

The present invention relates to a wire clamper used in a wire bonding apparatus.

2. Prior Art

The Japanese Patent Application Publication (Kokoku) No. 61-2294 discloses one example of the conventional wire clamper.

The clamper includes a movable arm and a fixed arm, and the movable arm is urged toward the fixed arm by a spring. The movable arm is opened and closed by a solenoid. When the solenoid is actuated, the projecting rod of the solenoid pushes the movable arm overcoming the driving force of the spring, and as a result, the movable arm is opened. When the solenoid is turned off, the movable arm is closed by the spring so that the movable arm is closed and clamps a bonding wire between the movable and fixed arms.

In this prior art, the clamper arms are operated via the solenoid provided on the clamper. Accordingly, the overall weight of the clamper is large, and the response of the clamper tends to be slow. Meanwhile, the load applied onto the bonding wire (i.e., the clamping load) to hold the bonding wire is provided by a spring force of approximately 40 to 50 gr. Thus, when a bonding head upon which the clamper is installed is moved fast, the arms of the clamper tends to rattle, causing the clamping load to be unstable.

In addition, the amount of the clamping load depends on the spring. As a result, when the clamping load is to be changed, it is necessary to replace the spring. It is, however, difficult to obtain a desired clamping load by changing the spring, and considerable time is required for the adjustment of the load.

The inventors of the present patent application previously filed a patent application for a device that solves the problems as described above (Ser. No. 08/031,237 based upon Japanese Patent Application No. 4-87454). In this device, the clamper has a pair of open/close arms so as to hold a bonding wire when the arms are closed, and at least one of the arms is opened and closed by the electrostrictive strain effect or magnetstrictive strain effect of a piezoelectric element.

Since the arms in this device are opened and closed by a piezoelectric element, the weight and response characteristics of the wire clamper can respectively be small and conspicuously high. In addition, since the clamping load is obtained from a piezoelectric element, the components for clamping the bonding wire do not rattle even when the bonding head moves fast. Also, since the clamping load can be changed by varying the voltage applied to the piezoelectric element, any desired clamping load can easily be obtained.

However, various prototypes and experiments of such a clamper made and conducted by the inventors unveiled several problems. The initial clamping load (that is, the clamping load with which a bonding wire is clamped by the clamping elements) at the time when no voltage has yet been applied to the piezoelectric element depends solely on the spring characteristics of the clamper arms to which the clamping elements are mounted. Thus, the clamping load can vary from wire clamper to wire clamper. As a result, in order to obtain a uniform clamping load, it is necessary to adjust the voltage applied to the piezoelectric element. Furthermore, when the variation in the clamping load is great, it may not be possible to eliminate the variation merely by adjusting the applied voltage.

SUMMARY OF THE INVENTION

Accordingly, the object of the present invention is to provide a wire clamper used in a wire bonding apparatus which can provide an even clamping load.

The first structure of the wire clamper of the present invention includes a pair of clamper arms that can open and close and a pair of clamping elements that are respectively provided at terminal ends of the clamper arms in order to hold a bonding wire in between, and the feature of the structure for accomplishing the object is that at least one of the clamper arms is movable so as to open and close by the electric strain or magnetic strain effect of a piezoelectric element, and a clamping load adjustment means (or a screw) is provided at the root end of the wire clamper so that an initial setting of the initial clamping load of the clamping elements is obtained via the clamping load adjustment means.

The second structure of the wire clamper of the present invention includes a pair of clamper arms that can open and close and a pair of clamping elements that are respectively provided at terminal ends of the clamper arms in order to hold a bonding wire in between, and the feature of the structure for accomplishing the object is that at least one of the clamper arms is movable to open and close by the electric strain or magnetic strain effect of a piezoelectric element, a clamping load adjustment means (or a first screw) is provided at the root end of the wire clamper so that an initial setting of the initial clamping load of the clamping elements is obtained via the clamping load adjustment means, and a clamping element adjustment means (or a second screw) is provided at the terminal end of one of the clamper arms so that the second screw is used so as to let a clamping element that is attached via an adhesive agent to one of the clamper arms positionally correspond to another clamping element of another clamper arm.

In the first structure described above, the space between the pair of clamping elements can be adjusted to a desired value via the clamping load adjustment means. For example, when the clamping elements are adjusted so that they come into contact lightly, the initial clamping load (with no voltage applied to the piezoelectric element) can be set evenly. Thus, the variation in the initial clamping load obtained from wire clamper to wire clamper can be small, and the same distance between the opened clamping elements is obtained as long as the same voltage is applied to the piezoelectric element.

In the second structure of the present invention, the following additional effect is obtained as well as the effect in the first structure. In other words, when one of the clamping elements is going to be mounted to one of the clamping arms via an adhesive agent, the clamping element is brought to approach the other clamping element using the clamping load adjustment means before the adhesive agent is hardened, and before the adhesive agent is hardened, the first clamping element is brought into a snug contact with the other clamping element by being adjusted by the clamping element adjustment screw. Thus, a parallel orientation with a high precision between the pair of clamping elements is obtained.

DETAILED DESCRIPTION OF THE INVENTION

An embodiment of the present invention will be described with reference to FIGS. 1 through 3.

Figure 1:
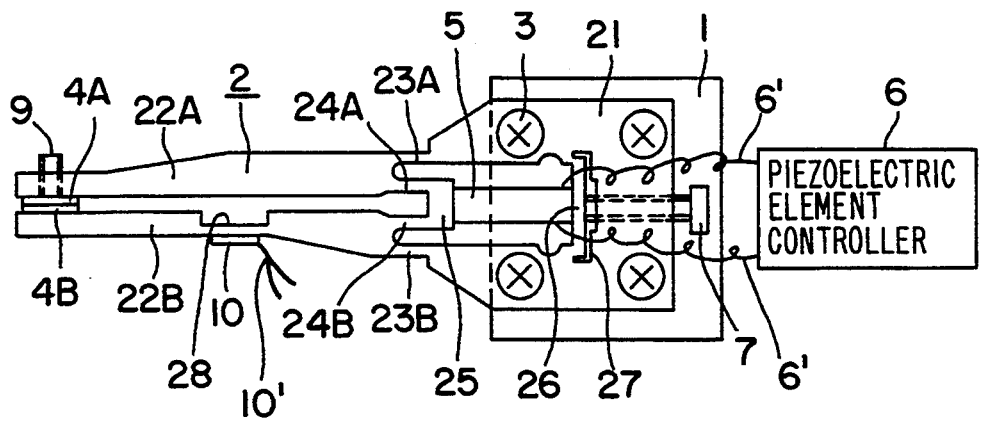
FIG. 1 is a top view of one embodiment of the wire clamper according to the present invention.

As shown in FIG. 1, a clamper main body 2 is mounted to a clamper support 1 by screws 3. The clamper support 1 is fastened to the bonding head of a bonding apparatus (not shown).

The clamper main body 2 comprises a base portion 21 which is fixed to the clamper support 1 by the screws 3 and a pair of clamper arms 22A and 22B. To the terminal ends of the pair of clamper arms 22A and 22B, clamping elements 4A and 4B are respectively attached.

Two first narrow portions 23A and 23B which are capable of making an elastic deformation are formed in the area that connects the base portion 21 and the clamper arms 22A and 22B. In addition, two second narrow portions 24A and 24B are formed on the clamper arms 22A and 22B so that they are located inside (when viewed above the FIGS. 1 and 3) the first narrow portions 23A and 23B. These second narrow portions 24A and 24B are connected together to form an operating portion 25. The first and second narrow portions 23A, 23B, 24A and 24B are formed so that they have a spring force which acts in a direction in which the clamping elements 4A and 4B are closed.

A slit groove 27 is formed in the base portion 21 of the clamper main body 2 so as to confront the operating portion 25, thus making a deformable diaphragm section 26.

A laminated piezoelectric actuator (hereinafter called "piezoelectric element") 5 is provided between the operating portion 25 and the diaphragm section 26 and connected to these two elements at both ends. The piezoelectric element 5 is actuated by a piezoelectric element controller 6 via two electrical lines 6'. The piezoelectric element 5 is installed so that its strain direction is oriented in the direction of the clamping surfaces of the clamping elements 4A and 4B.

A clamping load adjustment means or screw 7 is screwed into the base portion 21 of the clamper base body 2 so that the screw presses, with its end, against the diaphragm section 26.

Figure 2:
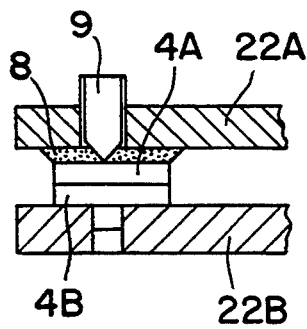
FIG. 2 is an enlarged cross section of the area of clamping elements used in the wire clamper of FIG. 1.

As shown in FIG. 2, the clamping element 4A is fixed to the clamper arm 22A via an adhesive agent 8, and a clamping element adjustment screw 9 which has a conical or rounded end is screwed into the clamper arm 22A at a location that corresponds to the clamping element 4A. The other clamping element 4B is pressure-fitted into a hole opened in the clamper arm 22B.

The clamping load adjustment screw 7 and the clamping element adjustment screw 9 will be described later.

The operation of the wire clamper shown in FIG. 1 will be described below:

When voltage is not applied to the piezoelectric element 5, the clamping elements 4A and 4B are in a closed position and clamp a bonding wire (not shown) between them with a fixed clamping load that is provided by the spring force derived from the narrow portions 23A, 23B, 24A and 24B.

When a voltage is applied to the piezoelectric element 5, the piezoelectric element 5 is caused to expand toward the clamping elements 4A and 4B (or to the left in FIG. 1) by the resulting electrostrictive strain effect or magnetstrictive strain effect, and the operating portion 25 is caused to shift in the same direction (i.e., to the left in FIG. 1). As a result, the narrow portions 23A, 23B, 24A and 24B bend outwardly (or up and down in FIG. 1), so that the clamping elements 4A and 4B are opened.

The amount of this movement of the clamping elements 4A and 4B is obtained from (a) the ratio between the length from the operating portion 25 to the narrow portions 23A and 23B and the length from the narrow portions 23A and 23B to the wire-clamping surfaces of the clamping elements 4A and 4B and (b) the amount of extension of the piezoelectric element 5.

Figure 3:
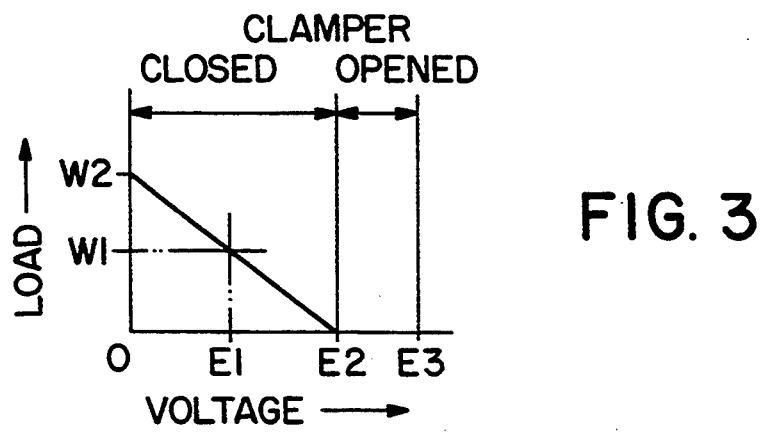
FIG. 3 is a graph showing the relationship between the voltage applied to the piezoelectric element and the clamping load.

The above-described matter may be described in greater detail as follows:

As shown in FIG. 3, when a voltage is applied to the piezoelectric element 5 beginning from a state where the voltage applied to the piezoelectric element 5 is zero and the clamping load is W2, the clamping load decreases in proportion to the increase in the voltage applied. When the voltage reaches E2, the clamping elements 4A and 4B are in contact with the bonding wire but the clamping load is zero. If the voltage is increased further, the clamping elements 4A and 4B are opened.

Accordingly, a desired clamping load W1 for clamping the bonding wire is obtained by applying a voltage of E1. In other words, a clamping load at a desired level can be set by ascertaining beforehand the relationship between the voltage and the clamping load, and then lowering the voltage by a given amount from the voltage value where the clamping elements 4A and 4B just come to contact the bonding wire (i.e., the voltage value where the clamping load is zero). Accordingly, in actual use, the voltage during wire clamping is set at E1, and the voltage when the bonding wire is released is set at E3.

To give one concrete example, a wire clamper may be constructed so that the clamping load W2 is approximately 80 to 100 gr when the voltage is zero and so that the clamping elements 4A and 4B are separated to open for a distance of approximately 50 to 70 microns when the voltage E3 is 100 V. In this case, the clamping load W1 is approximately 40 to 50 gr when the voltage E1 is approximately 50 to 60 V.

As seen from the above, the clamper arms 22A and 22B are operated by the piezoelectric element 5. Accordingly, the following effects are obtained:

(1) The weight of the piezoelectric element is light, and the one used in the embodiment is approximately 0.5 to 5 gr though the solenoids used in a conventional device weigh approximately 20 to 30 gr. Accordingly, weight reduction is secured.

(2) The response time of the solenoid is 1.5 to 2.0 ms, while that of the piezoelectric element 5 is 0.05 to 0.3 ms. Accordingly, the response time is conspicuously improved.

(3) In conventional devices, the clamping load is obtained via the driving force of a spring. Thus, the clamping elements can shake when the bonding head moves at a high speed.

In the present embodiment, on the other hand, since the driving force of the piezoelectric element 5 is large, the narrow portions 23A, 23B, 24A and 24B of the clamper arms 22A and 22B can be rigid. Accordingly, the clamping elements 4A and 4B will not shake even when the bonding head moves at a high speed. Thus, a stable clamping load is assured.

(4) In the present embodiment, the clamping load is obtained based upon the voltage applied to the piezoelectric element 5. Accordingly, clamping load at any desired level can easily be set.

A method which allows easy and accurate measurement and setting of the clamping load will be described below.

A cut-out 28 which provides an elastic deformation is formed on one side (or inner side) of the clamper arm 22B near the clamping element 4B, and a strain gauge 10 having outwardly extended wires 10' is attached to the other (or outer) side of the cut-out 28. With this structure having the strain gage 10, it is possible to know the relationship between the amount of bend of the cut-out 28 and the clamping load provided by the output value of the strain gauge 10, since the amount of bend of the cut-out 28 varies depending upon the clamping load.

Thus, by measuring beforehand the relationship between the output value of the strain gauge 10 and the clamping load, the voltage to be applied to the piezoelectric element 5 can be adjusted via the output value of the strain gauge 10 so that the clamping load is controlled.

Figure 4:
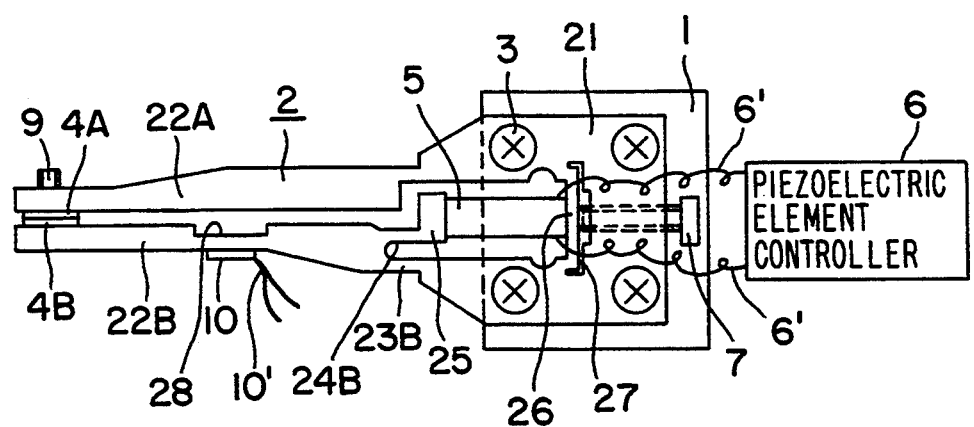
FIG. 4 is a top view of another embodiment of the wire clamper of the present invention.

FIG. 4 illustrates a wire clamper of another type. In the first embodiment described above, both of the clamper arms 22A and 22B are bent when they are opened and closed. In this embodiment in FIG. 4, on the other hand, only the clamper arm 22B is bent.

More specifically, there is no narrow portion 23A that is used in the first embodiment. Instead, this portion is made rigid. The clamper arm 22A is not continuous from the operating portion 25. Accordingly, only the clamper arm 22B bends in this embodiment.

An effect similar to that obtained in the previous embodiment can be obtained using this structure as well. However, in this embodiment, since only the clamper arm 22B bends, it may be hard (depending on the capacity of the piezoelectric element 5 used) to obtain a desired amount of opening. A larger amount of opening can be obtained in the structure in which both clamper arms 22A and 22B are bendable. Accordingly, such an arrangement is rather desirable.

Next, the assembly of the wire clampers illustrated in FIGS. 1 and 4 will be described below.

First, the clamping load adjustment screw 7 is loosened, and the piezoelectric element 5 is inserted into the space between the operating portion 25 and the diaphragm section 26. Then the piezoelectric element 5 is fixed in place by an adhesive agent, and the clamping element 4B is pressure fitted to the clamper arm 22B.

Next, the clamping load adjustment screw 7 is screwed in so that it presses against the diaphragm section 26. A preliminary pressure is thus applied to the piezoelectric element 5. As a result of this preliminary pressure, the narrow portions 23A, 23B, 24A and 24B bend outwardly (or up and down in the Figures), and the clamper arm 22A and clamping element 4B open.

The clamping load adjustment screw 7 is turned to a point where the amount of opening between the clamping elements 4A and 4B (after the clamping element 4A is attached to the clamper arm 22A as described below) becomes such a small value as, for example, 20 to 100 microns.

Next, the clamping element 4A is fixed to the clamper arm 22A via an adhesive agent 8. The adhesive agent 8 is a type having a relatively long setting time. Before the adhesive agent 8 sets, the clamping element adjustment screw 9 is screwed in so that the clamping element 4A is caused to fit tightly against the clamping element 4B. Then, the adhesive agent is allowed to stand until it dries and sets.

The work may be performed in another way as follows:

First, the clamping element 4B is fastened to the clamper arm 22B as described above. Then, with the clamping load adjustment screw 7 loosened, the piezoelectric element 5 is inserted into the space between the operating portion 25 and the diaphragm section 26 and is fastened in place by an adhesive agent.

Next, the clamping load adjustment screw 7 is screwed in so that it presses against the diaphragm section 26. As a result, the clamper arms 22A and 22B open. In this case, the clamper arms 22A and 22B are opened so that the space between the clamping element 4B and the surface of the clamper arm 22A, to which the clamping element 4A is to be attached, is sufficiently greater than the thickness of the clamping element 4A.

Next, with the clamping element adjustment screw 9 loosened, the clamping element 4A is attached to the clamper arm 22A via the adhesive agent 8. Then, the clamping load adjustment screw 7 is loosened so that the gap between the clamping elements 4A and 4B is adjusted to a small value, such as 20 to 100 microns. Then, the clamping element adjustment screw 9 is screwed in so that the clamping element 4A is caused to fit tightly against the clamping element 4B. Afterward, the adhesive agent is allowed to stand until it dries and sets.

After the adhesive agent 8 has dried and set, it is checked whether or not the clamping elements 4A and 4B are well fitted. Then, one of the following operations is performed depending on whether the fitting of the clamping elements 4A and 4B is completely snug or not.

If the clamping elements 4A and 4B show a completely snug fit, the clamping load adjustment screw 7 is screwed in so that it presses against the diaphragm section 26 until it is confirmed that the clamping elements 4A and 4B show a slight separation. Then, the clamping load adjustment screw 7 is loosened so that the clamping elements 4A and 4B are caused to contact each other lightly. Afterward, the clamping load adjustment screw 7 is fastened in place by means of an adhesive agent, etc.

If, on the other hand, the clamping elements 4A and 4B do not show a completely snug fit, the clamping load adjustment screw 7 is loosened so that the clamping elements 4A and 4B are brought to contact each other lightly. Then, the clamping load adjustment screw 7 is fastened in place by an adhesive agent, etc.

Thus, the gap between the clamping elements 4A and 4B can be freely adjusted via the clamping load adjustment screw 7. Accordingly, by adjusting the gap in such a manner that the clamping elements 4A and 4B come into contact with each other lightly, the initial clamping load (which is for clamping the bonding wire by the clamping elements 4A and 4B with no voltage applied to the piezoelectric element 5) can be adjusted to a uniform level. In other words, since the variation in the initial clamping load from wire clamper to wire clamper is small, the same amount of opening of the clamping elements 4A and 4B is obtained when the same voltage is applied to the piezoelectric element 5.

Furthermore, since the clamping element 4A is caused to fit snugly to the clamping element 4B by means of the clamping load adjustment screw 7 and clamping element adjustment screw 9 prior to the setting of the adhesive agent 8 of the clamping element 4A, the precision of the parallel orientation of the clamping elements 4A and 4B can be improved.

We claim:

1. A wire clamper used in a wire bonding apparatus characterized in that said wire clamper comprises: a pair of clamper arms which open and close and a pair of clamping elements that are respectively provided on said clamper arms so as to clamp a bonding wire; wherein at least one of said clamper arms is opened and closed by an electric strain or magnetic strain effect of a piezoelectric element, a clamping load adjustment means is provided on said wire clamper so as to set an initial clamping load of said clamping elements, and a clamping element adjustment means is provided which presses one of said clamping elements against another clamping element provided on said other clamper arm when said first clamping element is fastened to a corresponding clamper arm via an adhesive agent.

2. A wire clamper according to claim 1, wherein said clamping load adjustment means consists of a diaphragm section which is installed in a piezoelectric element attachment part of a clamper main body which has pair of clamper arms, and a clamping load adjustment screw which opens and closes said clamper arms by applying a preliminary pressure to said piezoelectric element via said diaphragm section.

3. A wire clamper for a bonding apparatus comprising:
 a clamper main body mountable at a root end thereof to a clamper support, said clamper main body including a pair of clamping arms extending from said root end of said clamper main body with narrow portions and an operating portion between said root end and said clamper arms, one of said clamper arms being provided with an adjustment screw at a terminal end thereof;
 a pair of clamping elements provided at terminal ends of said clamper main body, one of said pair of clamping elements being provided by an adhesive agent such that said one of said clamping elements come into a snug contact with another one of said clamping elements via said adjustment screw before said adhesive agent hardens;
 a piezoelectric element installed between said root end and said operating portion of said clamper main body; and
 a clamping load adjustment screw screwed into said root end of said clamper main body.

* * * * *